US006905910B1

(12) United States Patent
Shiu et al.

(10) Patent No.: US 6,905,910 B1
(45) Date of Patent: Jun. 14, 2005

(54) METHOD OF PACKAGING AN OPTICAL SENSOR

(75) Inventors: Hei Ming Shiu, Hong Kong (HK); Wai Wong Chow, Hong Kong (HK); Kam Fai Lee, Hong Kong (HK)

(73) Assignee: Freescale Semiconductor, Inc., Austin, TX (US)

( * ) Notice: Subject to any disclaimer, the term of this patent is extended or adjusted under 35 U.S.C. 154(b) by 0 days.

(21) Appl. No.: 10/752,159

(22) Filed: Jan. 6, 2004

(51) Int. Cl.[7] ............................................. H01L 21/44
(52) U.S. Cl. ...................... 438/106; 257/666; 257/678; 257/680
(58) Field of Search ...................... 257/666, 678–680, 257/99–100; 438/106, 121, 22

(56) References Cited

U.S. PATENT DOCUMENTS

| 5,950,074 | A | 9/1999 | Glenn et al. |
| 6,034,429 | A | 3/2000 | Glenn et al. |
| 6,117,705 | A | 9/2000 | Glenn et al. |
| 6,121,675 | A | 9/2000 | Fukamura et al. |
| 6,143,588 | A | 11/2000 | Glenn |
| 6,266,197 | B1 | 7/2001 | Glenn |
| 6,268,231 | B1 | 7/2001 | Wetzel |
| 6,268,654 | B1 | 7/2001 | Glenn et al. |
| 6,274,927 | B1 | 8/2001 | Glenn |
| 6,285,064 | B1 | 9/2001 | Foster |
| 6,342,406 | B1 | 1/2002 | Glenn et al. |
| 6,384,472 | B1 | 5/2002 | Huang |
| 6,395,582 | B1 | 5/2002 | Sohn et al. |
| 6,410,981 | B2 | 6/2002 | Tao |
| 6,410,987 | B1 | 6/2002 | Kanemoto et al. |
| 6,822,326 | B2 * | 11/2004 | Enquist et al. ............... 257/729 |
| 2001/0014486 | A1 | 8/2001 | Glenn |
| 2002/0110951 | A1 * | 8/2002 | Wang et al. ................. 438/106 |
| 2004/0188699 | A1 * | 9/2004 | Kameyama et al. .......... 257/99 |

FOREIGN PATENT DOCUMENTS

WO     WO 01/15237 A1     3/2001

\* cited by examiner

*Primary Examiner*—Hoai Pham
*Assistant Examiner*—Nathan W. Ha
(74) *Attorney, Agent, or Firm*—Charles E. Bergere

(57) ABSTRACT

An image sensor device includes a first, QFN type leadframe to which a sensor IC is electrically connected. A second leadframe is provided for holding a lens. A third leadframe is positioned between the first and second leadframes to appropriately space the IC from the lens. Multiple sensor devices are assembled at the same time by the use of leadframe panels.

8 Claims, 5 Drawing Sheets

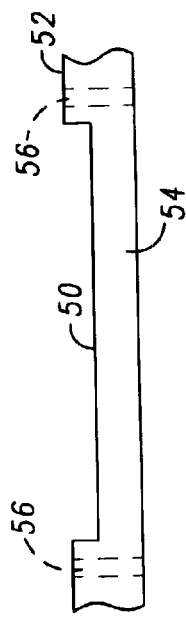
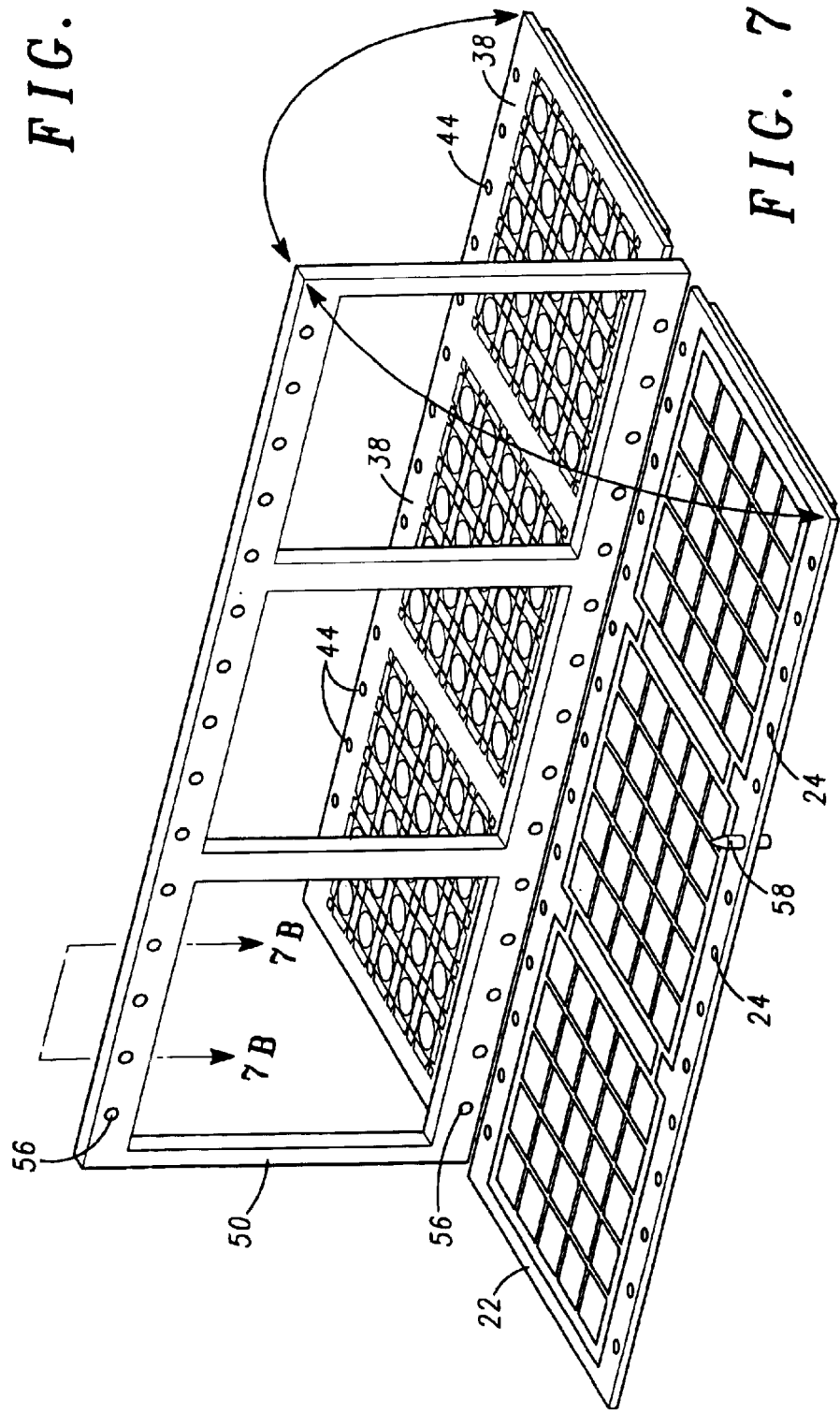

METHOD OF PACKAGING AN OPTICAL SENSOR

BACKGROUND OF THE INVENTION

The present invention relates to image and optical sensors and, more particularly, to a method of packaging an optical sensor and the resulting packaged sensor product.

There has been a constant demand for smaller and smarter industrial and consumer electronic products such as digital cameras, camcorders, audio players, etc. Such miniaturization and increased functionality has benefited from advances in the design and manufacturing of semiconductor circuits and wafers. There has also been a marked increase in the use of optical and image sensors in electronic products. Such sensor devices are packaged in a variety of ways. For example, an optical sensor in a ceramic leadless chip carrier has good optical quality, but large package form factor. A wafer level package has a lesser form factor and good optical quality, but is very expensive. Image sensors are also available as a molded quad flat pack (QFP). While the QFP has a moderate cost, it has low optical quality and a large package form factor. Further, it is important both to accurately align the optical sensor image center with the optical axis of the optical lens and provide proper glass height stand off.

It would be advantageous to provide a packaged image sensor with a low package form factor, moderate cost, and high optical quality.

BRIEF DESCRIPTION OF THE DRAWINGS

The foregoing summary, as well as the following detailed description of the present invention, will be better understood when read in conjunction with the appended drawings. For the purpose of illustrating the invention, there is shown in the drawings an embodiment that is presently preferred. It should be understood, however, that the invention is not limited to the precise arrangement and instrumentalities shown. In the drawings:

FIG. 7A is a perspective view illustrating a step of placing a third leadframe panel between the first and second leadframe panels in accordance with a method of the present invention and FIG. 7B is a cross-sectional view of the third leadframe of FIG. 7A;

DETAILED DESCRIPTION OF PREFERRED EMBODIMENTS

Figure 1:
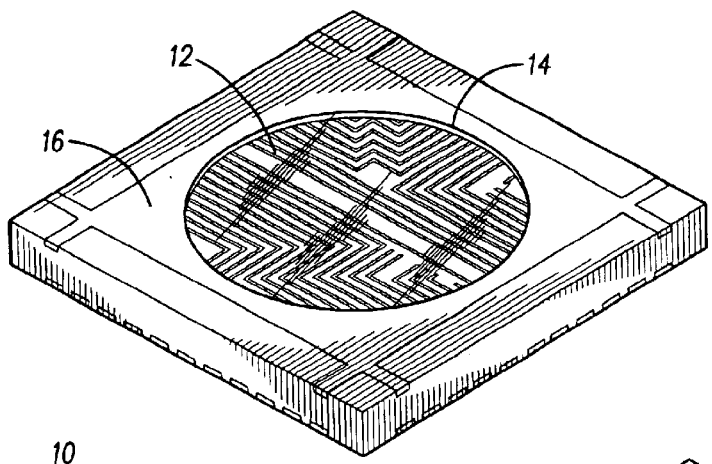
FIG. 1 is an enlarged, top perspective view of an optical sensor device in accordance with the present invention.

The detailed description set forth below in connection with the appended drawings is intended as a description of the presently preferred embodiments of the invention, and is not intended to represent the only forms in which the present invention may be practiced. It is to be understood that the same or equivalent functions may be accomplished by different embodiments that are intended to be encompassed within the spirit and scope of the invention.

Certain features in the drawings have been enlarged for ease of illustration and the drawings and the elements thereof are not necessarily in proper proportion. However, those of ordinary skill in the art will readily understand such details. In the drawings, like numerals are used to indicate like elements throughout.

The present invention provides an image sensor device with low cost and high optical quality in a near chip scale package based on standard high density array format, quad flat no-lead (QFN) assembly infrastructure. A tight tolerance in assembly height and unique mechanical structure design provides close dimension matching with mold cavity height. The packaged sensor device uses an inner leadframe panel as a precise height standoff object to control the focal length of the sensor. The lens is attached to its own leadframe panel with tape. The tape prevents resin bleeding, which keeps the lens clean and facilitates post-mold cleaning.

More particularly, in one embodiment, the present invention provides an image sensor device including a first leadframe having a central die receiving area surrounded by a plurality of lead fingers and a sensor integrated circuit (IC) disposed within the die receiving area of the first leadframe. The IC has a first surface with an active area and a peripheral bonding pad area. The peripheral bonding pad area includes a plurality of bonding pads. A plurality of wires are wirebonded to respective ones of the IC bonding pads and corresponding ones of the leadframe lead fingers of the first leadframe, thereby electrically connecting the IC and the first leadframe. A second leadframe having a central lens receiving area is provided. A transparent lens is disposed within the central lens receiving area of the second leadframe and the second leadframe is located over the first leadframe such that the lens is disposed over the IC active area. A transparent adhesive is disposed on the IC active area to secure the lens to the IC. A mold compound is injected between the first and second leadframes, and over the wirebonds. During assembly of the image sensor device, a third leadframe is located between the first and second leadframes for controlling the spacing between the IC active surface and the lens.

In another embodiment, the present invention provides a method of packaging an optical sensor. The method includes the steps of:

providing a first leadframe panel including a plurality of first leadframes, each first leadframe having a plurality of lead fingers surrounding a central die receiving area;

placing a first tape over a first side of the first leadframe panel;

providing a plurality of sensor integrated circuits (IC), each IC having a first surface and a second surface, the first surface having an active area and a peripheral bonding pad area, the peripheral bonding pad area including a plurality of bonding pads;

placing the plurality of ICs within respective ones of the die receiving areas of the first leadframes of the first leadframe panel, wherein the IC second surfaces are secured within the die receiving areas by the first tape;

electrically connecting respective ones of the IC bonding pads of the ICs and corresponding ones of the leadframe lead fingers of the first leadframes with a plurality of wires via wirebonding, thereby electrically connecting the ICs and the first leadframes;

providing a second leadframe panel having a plurality of second leadframes, each of the second leadframes having a central lens receiving area;

placing a second tape over a first side of the second leadframe panel;

placing a transparent lens in each of the lens receiving areas of the second leadframes, wherein the lenses are secured within the lens receiving areas by the second tape;

putting globs of a clear adhesive on respective ones of the active areas of the ICs;

providing a third leadframe panel;

placing the third leadframe panel between the second sides of the first and second leadframe panels;

pressing the first and second leadframe panels towards each other such that respective ones of the ICs are attached to corresponding ones of the lenses by the globs of adhesive;

injecting a mold compound between the first and second leadframe panels such that the mold compound covers the bonding pads and the wires;

removing the tape from the first sides of the first and second leadframe panels; and separating the leadframes from the panels, thereby forming individual devices.

Figure 2:
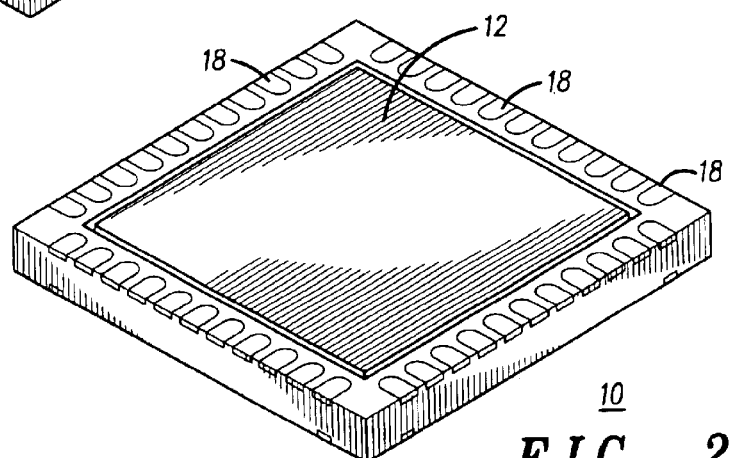
FIG. 2 is an enlarged, bottom perspective view of the optical sensor device of FIG. 1.

Referring to FIG. 1, an enlarged, top perspective view of a packaged optical sensor device 10 in accordance with the present invention is shown. The sensor device 10 preferably is a QFN (quad flat no-lead) type package. The QFN type package is preferred because of its small form factor, low profile, and low assembly cost. The sensor device 10 includes a sensor integrated circuit (IC) 12 visible through a lens 14 that is fitted within a second leadframe 16. FIG. 2 is an enlarged, bottom perspective view of the optical sensor device 10, which shows a bottom side of the IC 12 and lead fingers 18 of a first leadframe 20 (see FIG. 3). The packaged device 10 is rectangular or square-shaped and the lens 14 is generally circular 14. However, the device 10 and lens are not limited to such shapes, as the shape of the package and the shape of the lens may vary.

Figure 3:
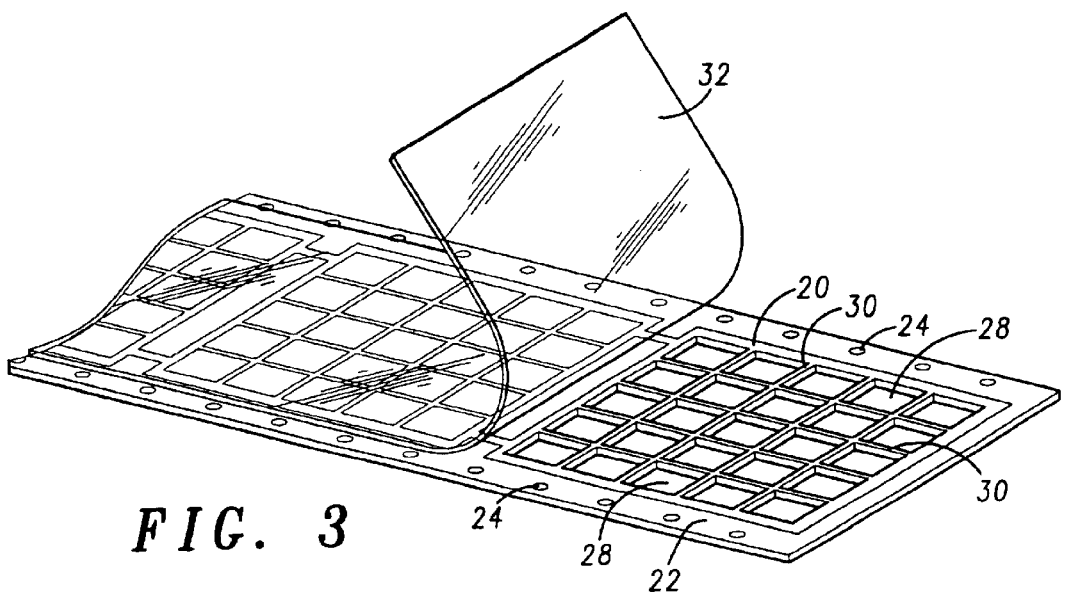
FIG. 3 is a perspective view of a first leadframe panel used for forming optical sensor devices in accordance with the present invention.

FIGS. 3–11 show various steps in a process for packaging the sensor device 10. FIG. 3 is a perspective view of a first leadframe panel 22 having a plurality of the first leadframes 20. A first step in the process of packaging the sensor device 10 is to provide the first leadframe panel 22. In the embodiment shown, the first leadframe panel 22 includes three (3) 5×5 matrices of the first leadframes 20. However, the leadframe panel 22 may include more or fewer of the leadframes 20. An outer perimeter or edge of the first leadframe panel 22 includes a plurality of spaced holes 24 that are used to align the first leadframe panel 22 with other leadframe panels, as discussed in more detail below. Each of the individual first leadframes 20 comprises a plurality of lead fingers 18 (FIG. 4) surrounding a central die receiving area 28. The lead fingers 18 extend inwardly from connection bars 30 towards the die receiving areas 28. In an alternative embodiment, the first leadframes 20 may include flag members for holding the ICs 12. The first leadframe panel 22 is formed of a metal, such as copper and the first leadframes 20 are formed by punching, stamping or etching, as is known by those of skill in the art.

FIG. 3 shows a step of placing a first tape 32 over a first side of the first leadframe panel 22. The first tape 32 is of a type known by those of skill in the art and has an adhesive on one side to which the first leadframe panel 22 adheres. After the first tape 32 is applied to the first side of the first leadframe panel 22, the sensor ICs 12 are placed in the die receiving areas 28 of the first leadframes 20 of the first leadframe panel 22. Each of the ICs 12 has a first surface and a second surface. The first surface has an active area and a peripheral bonding pad area. The peripheral bonding pad area includes a plurality of bonding pads. The sensor ICs 12 are preferably a CMOS sensor device of a type that is known by those of skill in the art and readily commercially available. The ICs 12 have a thickness or height of about 15 mils. Each IC 12, in addition to including a light receiving or active area, includes circuitry and logic, such as an A/D converter and a DSP or logic area for performing arithmetic type operations. The ICs 12 are placed in the die receiving areas 28 such that the second surfaces (bottom side) of the ICs 12 adhere to the first tape 32 and thus the ICs 12 are secured within the die receiving areas 28 by the first tape 32. By taking advantage of the capability of accurate and tight control in leadframe positional tolerance manufacturing, the ICs 12 are precisely located in the die receiving areas 28 of the first leadframes 20.

Figure 4:
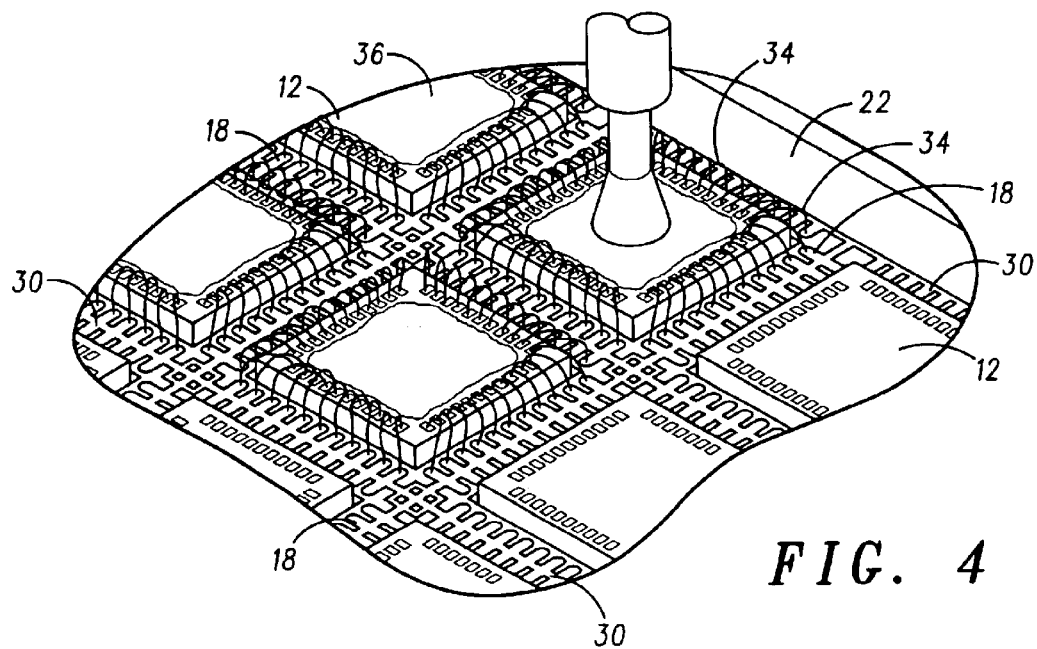
FIG. 4 is an enlarged perspective view illustrating a step of attaching an image sensor IC to the first leadframe, wirebonding the IC to the first leadframe, and disposing an adhesive on an active area of the IC in accordance with a method of the present invention.

FIG. 4 is an enlarged perspective view illustrating showing the sensor ICs 12 secured within the die receiving areas 28. A plurality of wires 34 are wirebonded to respective ones of the IC bonding pads and corresponding ones of the lead fingers 18, thereby electrically connecting the ICs 12 and the leadframes 22. Wirebonding is performed in a conventional manner. Any electrically conductive metal or combination of metals, such as are known by those of skill in the art, may be used to form the wires 34. Suitable bond wires typically comprise a conductive metal such as copper or gold and may be either fine wires (<50 µm in diameter) or heavy wires (>50 µm in diameter). In the presently preferred embodiment, the wires 34 are fine wires formed of gold. After the ICs 12 are electrically connected to the first leadframes 20 via wirebonding, globs of a clear adhesive 36 are disposed on the active areas of the ICs 12. The adhesive globs 36 may comprise a clear epoxy in liquid form, before curing. The adhesive globs 36 can be deposited onto the sensor active areas by any dispensing system.

Figure 5:
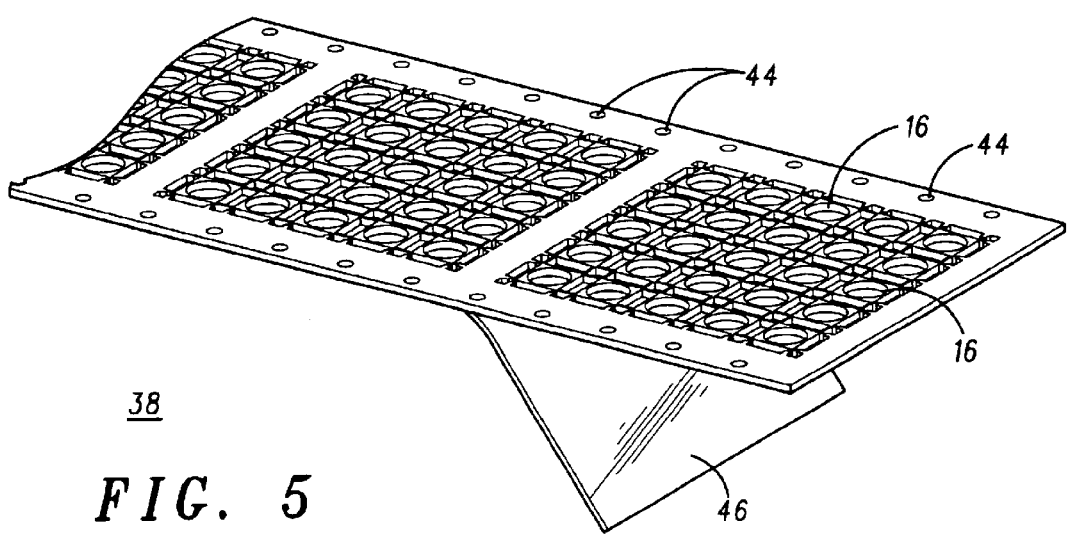
FIG. 5 is a perspective view of a second leadframe panel used for forming optical sensor devices in accordance with the present invention.
Figure 6:
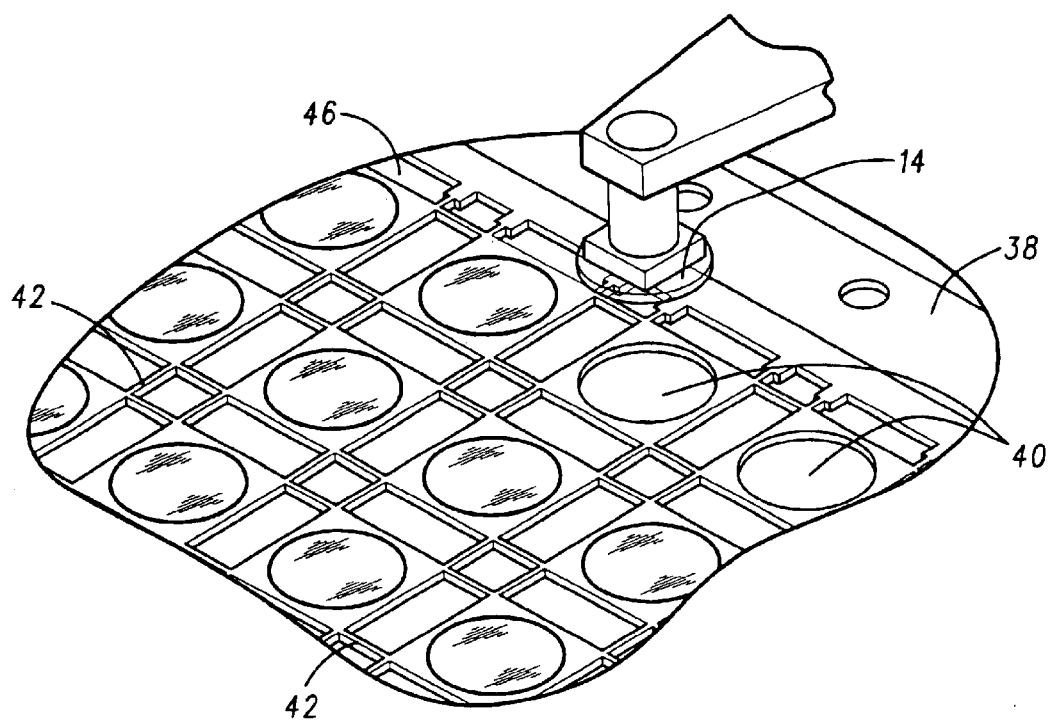
FIG. 6 is an enlarged perspective view of a step of placing lenses in second leadframes of the second leadframe panel of FIG. 5 in accordance with a method of the present invention.

FIG. 5 is a perspective view of a second leadframe panel 38 used for forming the optical sensor devices 10. The second leadframe panel 38 includes a plurality of the second leadframes 16. The second leadframe panel 38 and the second leadframes 16 are sized and shaped to match the first leadframe panel 22 and the first leadframes 20, respectively. Thus, in the embodiment shown, the second leadframe panel 38 includes three (3) 5×5 matrices of the second leadframes 16. Also like the first leadframe panel 22, the second leadframe panel 38 may be metal, such as copper, and formed by pressing, stamping or etching. Each of the second leadframes 16 comprises an area with a central lens receiving area 40 (FIG. 6). The second leadframes are connected via area connection bars 42. The second leadframe panel 38 preferably includes a plurality of spaced holes 44 along its perimeter. FIG. 5 shows the second leadframe panel 38 with a second tape 46 placed over a first side thereof. In the drawing, the second tape 46 is on the underside of the second leadframe panel 38.

FIG. 6 is an enlarged perspective view of a step of placing the lenses 14 in the lens receiving areas 40 of the second leadframes 16 of the second leadframe panel 38. The lenses 14 may be clear plastic or glass. Preferably the lenses 14 are a non-reflective optical grade glass and have a thickness of about 15 to 16 mils. The lenses 14 may be coated with various materials to filter light, as desired. The lenses 14 are secured within the lens receiving areas 40 by an adhesive on the surface of the second tape 46. Like the first leadframes 20, the ability to perform accurate and tight control in leadframe positional tolerance manufacturing allows the lenses 14 to be precisely located in the second leadframes 16.

Referring now to FIG. 7A, a perspective view illustrating a step of placing a third leadframe panel 50 between the first and second leadframe panels 22 and 38 is shown. More particularly, the third leadframe panel 50 is placed between the second sides of the first and second leadframe panels 22 and 38. The first and second leadframe panels 22 and 38 are then pressed towards each other such that respective ones of the ICs 12 are attached to corresponding ones of the lenses 14 by the globs of adhesive 36. Further, the pressing action insures that the globs of adhesive 36 are spread uniformly over the surfaces of the ICs 12. The third leadframe panel 50 acts as a precise stand off of the lenses 14 from the ICs 12.

FIG. 7B is a cross-sectional view along lines A—A of the third leadframe panel 50. The third leadframe panel 50 includes edge portions 52 and a central portion 54. The central portion 54 has been etched to reduce its height to allow for a mold compound to be injected between the first and second leadframe panels 22 and 38 and around the bond wires 34, as discussed below. The third leadframe panel 50 also includes a plurality of spaced holes 56. Preferably the first, second and third leadframe panels 22, 38 and 50 are all formed of the same material so that they have the same CTE (coefficient of thermal expansion). In the presently preferred embodiment, the three leadframe panels 22, 38 and 50 are made of stamped: or etched copper.

Figure 8:
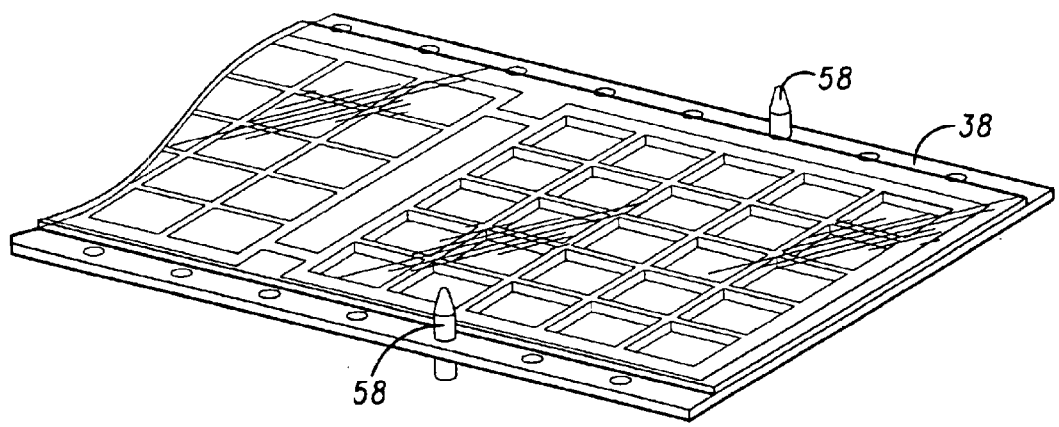
FIG. 8 is an enlarged perspective view showing a leadframe panel alignment step in accordance with a method of the present invention.

FIG. 8 is an enlarged perspective view showing a leadframe panel alignment step. In this step, the first, second and third leadframe panels 22, 38 and 50 are aligned by guide pins 58 inserted into the holes 24, 44 and 56 of the respective leadframe panels. The holes 24, 44 and 56 of the respective leadframe panels are located in identical locations around the respective panels to allow for precise alignment of the panels. Precisely aligning the panels, coupled with the very precise placement of both the ICs 12 and the lenses 14 provides precise alignment between the optical axes of the lenses 14 with the centers of the respective ICs 12, which is of critical importance in assembling image sensor devices. As is known by those of skill in the art, misalignment of the optical axis of the lens and sensor image circle center is the major cause of defects and thus yield loss in optical sensor manufacturing. By using leadframes for receiving both the ICs 12 and the lens 14, the present invention allows for very accurate placement and thus improved alignment accuracy. A heat curing process may be performed to cure and harden the adhesive globs 36, which the bonds the lenses 14 to the active areas of the ICs 12.

Figure 9:
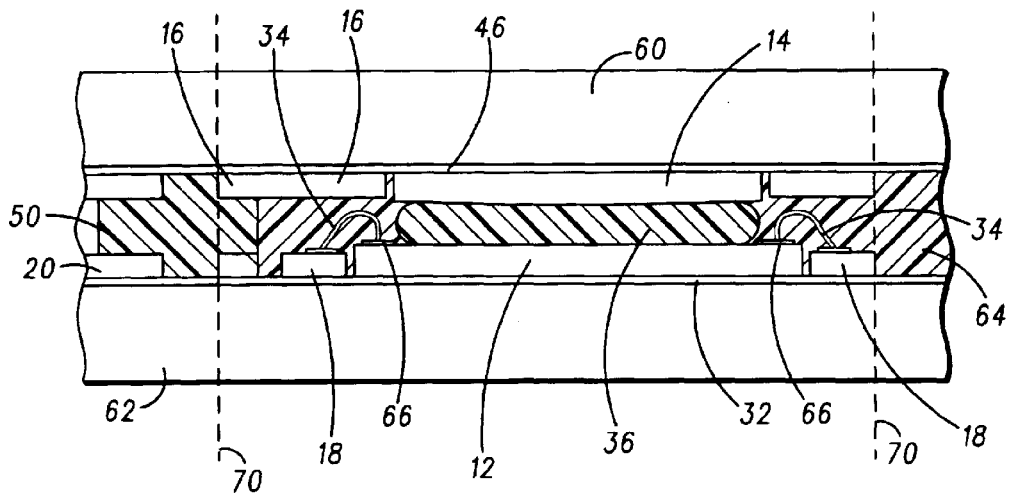
FIG. 9 is a greatly enlarged cross-sectional view illustrating a molding step in accordance with a method of the present invention.

FIG. 9 illustrates a molding step in the process of packaging an optical sensor in accordance with the present invention. Upper and lower molds 60 and 62 are placed over the second and first leadframe panels 38 and 22, respectively. A mold compound 64 is then injected between the first and second leadframe panels 22 and 38 such that the mold compound 64 covers the IC bonding pads 66, bond wires 34 and a part of the lead fingers 18. As previously discussed, the third leadframe panel 50 serves as a standoff between the first and second leadframe panels 22 and 38, and maintains the lenses 14 at a predetermined distance from the ICs 12. For devices around the periphery of the matrix, standoff is maintained by the rigid edge of the third leadframe panel 50. For units in the center of the matrix, during the mold injection process, the injected mold compound pushes the respective first and second leadframes 20 and 16 apart such that the standoff for the center units is obtained. In a typical plastic IC packaging process, the mold compound injection pressure is over 5 tons, which insures that the mold compound is packed densely.

Figure 10:
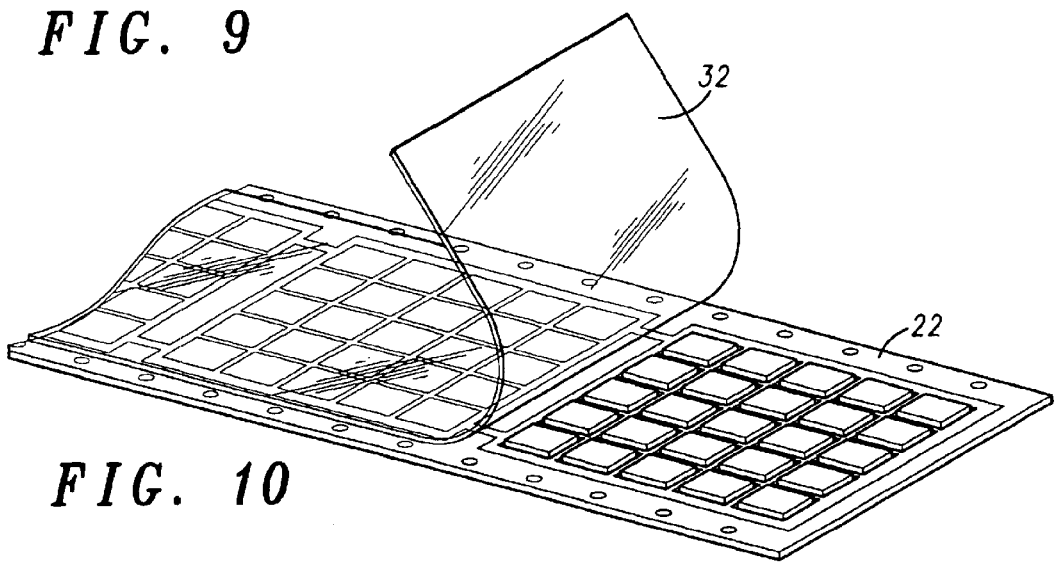
FIG. 10 is perspective view illustrating a tape removal step in accordance with a method of the present invention.
Figure 11:
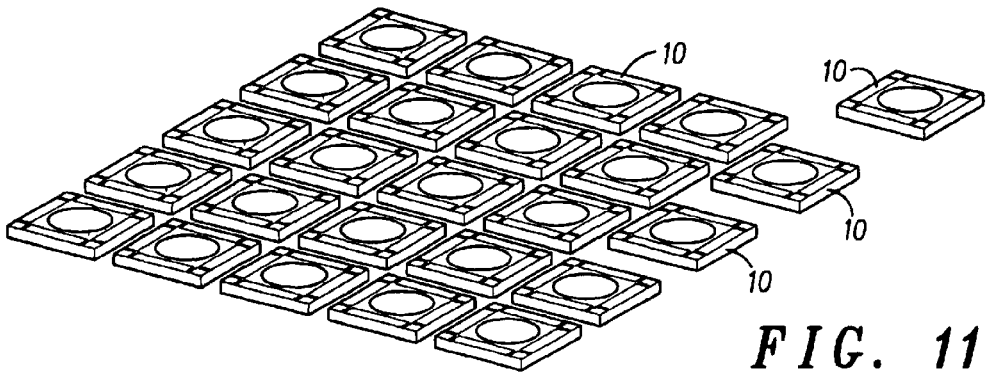
FIG. 11 is a perspective view illustrating a dicing step in accordance with a method of the present invention.

After injection of the mold compound 64 and curing, the first and second tapes 32 and 46 are removed from the first sides of the first and second leadframe panels 22 and 38. The first and second tapes 32 and 46 may be removed manually or with commercially available equipment. FIG. 10 shows the first tape 32 being removed from the first leadframe panel 22. The second tape 46 is removed in the same manner. The matrix of formed devices is then diced to form individual devices, as shown in FIG. 11. The dicing may be performed by sawing, as is known by those of skill in the art. FIG. 9 shows the locations with dashed lines 70 along which the leadframes may be cut. In one embodiment, the image sensor device 10 has an overall height of about 40 mils. The lens 14 and clear adhesive globs 36 allow light to pass therethrough and onto the active area of the sensor IC 12. Because the lenses 14 are covered by the second tale 46, resin bleeding onto the lenses is avoided. However, if any resin bleeding onto the lenses 14 should occur, a subsequent water jet cleaning can be performed to remove such resin. The second tape 46 also avoids potential surface scratching of the lenses 14.

The description of the preferred embodiments of the present invention have been presented for purposes of illustration and description, but are not intended to be exhaustive or to limit the invention to the forms disclosed. It will be appreciated by those skilled in the art that changes could be made to the embodiments described above without departing from the broad inventive concept thereof. It is understood, therefore, that this invention is not limited to the particular embodiments disclosed, but covers modifications within the spirit and scope of the present invention as defined by the appended claims.

What is claimed is:

1. A method of packaging an optical sensor, comprising the steps of:

provided a first leadframe panel including a plurality of first leadframes, each first leadframe having a plurality of lead fingers surrounding a central die receiving area;

placing a first tape over a first side of the first leadframe panel;

providing a plurality of sensor integrated circuits (IC), each IC having a first surface and a second surface, the first surface having an active area and a peripheral bonding pad area, the peripheral bonding pad area including a plurality of bonding pads;

placing the plurality of ICs within respective ones of the die receiving areas of the first leadframes of the first leadframe panel, wherein the IC second surfaces are secured within the die receiving areas by the first tape;

electrically connecting respective ones of the IC bonding pads of the ICs and corresponding ones of the leadframe lead fingers of the first leadframes with a plurality of wires via wirebonding, thereby electrically connecting the ICs and the first leadframes;

providing a second leadframe panel having a plurality of second leadframes, each of the second leadframes having a central lens receiving area;

placing a second tape over a first side of the second leadframe panel;

placing a transparent lens in each of the lens receiving areas of the second leadframes, wherein the lenses are secured within the lens receiving areas by the second tape;

putting globs of a clear adhesive on respective ones of the active areas of the ICs;

providing a third leadframe panel;

placing the third leadframe panel between the second sides of the first and second leadframe panels;

pressing the first and second leadframe panels towards each other such that respective ones of the ICs are attached to corresponding ones of the lenses by the globs of adhesive;

injecting a mold compound between the first and second leadframe panels such that the mold compound covers the bonding pads and the wires; removing the tape from the first sides of the first and second leadframe panels; and separating the leadframes from the panels, thereby forming individual devices.

2. The method of packaging an optical sensor of claim 1, wherein the separating step comprises singulating the leadframe panels with a saw.

3. The method of packaging an optical sensor of claim 2, wherein the formed individual devices are QFN type devices.

4. The method of packaging an optical sensor of claim 1, further comprising the step of aligning the first, second and third leadframe panels using at least one alignment pin inserted into holes located along edges of the first, second and third leadframe panels.

5. The method of packaging an optical sensor of claim 1, wherein at least one side of the third leadframe is partially etched to allow for injection of the mold compound between the first and second leadframe panels.

6. The method of packaging an optical sensor of claim 1, wherein the lenses comprise glass.

7. The method of packaging an optical sensor of claim 1, wherein the second tape protects the lenses from resin bleeding.

8. The method of packaging an optical sensor of claim 1, wherein a height of the third leadframe panel is determined in accordance with a focal length of the ICs and their respective lenses.

* * * * *